United States Patent
Yu et al.

(10) Patent No.: US 8,629,356 B2
(45) Date of Patent: Jan. 14, 2014

(54) MAGNETIC FIELD SHIELDING RAISED FLOOR PANEL

(75) Inventors: Chwen Yu, Taipei (TW); Yung-Ti Hung, Hsinchu (TW); Kuo-An Yeh, Kaohsiung (TW); Tzu-Sou Chuang, Hsinchu (TW); Chien-Teh Huang, New Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/328,543

(22) Filed: Dec. 16, 2011

(65) Prior Publication Data

US 2013/0153285 A1 Jun. 20, 2013

(51) Int. Cl.
*H05K 9/00* (2006.01)

(52) U.S. Cl.
USPC .............................. 174/391; 174/386; 361/818

(58) Field of Classification Search
USPC ........ 361/679.01, 679.02, 816, 818; 174/386, 174/391; 248/152; 52/263, 126.6, 126.7, 52/220.1; 333/12
See application file for complete search history.

(56) References Cited

U.S. PATENT DOCUMENTS

| 2,913,361 | A | * | 11/1959 | Fitz | 148/110 |
| 4,603,532 | A | * | 8/1986 | Watson | 52/802.11 |
| 6,028,266 | A | * | 2/2000 | Birke | 174/388 |
| 6,256,952 | B1 | * | 7/2001 | Fahy et al. | 52/263 |
| 6,584,739 | B2 | * | 7/2003 | Zeif | 52/263 |
| 6,983,570 | B2 | * | 1/2006 | Mead | 52/263 |
| 7,360,343 | B1 | * | 4/2008 | Spransy et al. | 52/263 |
| 7,509,782 | B2 | * | 3/2009 | Colosimo et al. | 52/792.1 |
| 7,576,289 | B2 | * | 8/2009 | Kessel | 174/372 |
| 8,099,912 | B2 | * | 1/2012 | DeJonge et al. | 52/126.2 |
| 2002/0144477 | A1 | * | 10/2002 | Chen | 52/263 |

\* cited by examiner

*Primary Examiner* — Boris L. Chervinsky
*Assistant Examiner* — Pete Lee
(74) *Attorney, Agent, or Firm* — Lowe Hauptman & Ham LLP

(57) ABSTRACT

A magnetic field shielding raised floor panel having a plurality of grain-oriented electrical steel (GOES) sections. The orientation of each GOES section is parallel to a top surface of the section. The plurality of GOES sections can include sidewall and lip portions. The plurality of GOES sections can be perforated to permit air flow through the GOES section. Openings in adjacent perforated GOES sections do not substantially overlap.

20 Claims, 2 Drawing Sheets

MAGNETIC FIELD SHIELDING RAISED FLOOR PANEL

BACKGROUND

Raised floor panels are commonly used in rooms housing electronic equipment, such as servers and scanning electron microscopes. The raised floor panels raise a walking level of the room above the structural level of the room in order to provide a space for cables and tools (e.g. transformers) to power various pieces of electronic equipment. Perforated raised floor panels also enhance ventilation. Electronic equipment generates a large amount of heat and failure to properly remove heat can cause the equipment to malfunction.

The cables can also cause electronic equipment to malfunction. As current passes through the cables, a magnetic field is generated based on Ampere's Law. The magnetic field radiates from the cable and impacts the performance of nearby electronic equipment. As the current in the cable increases, the strength and size of the magnetic field also increases. Conventional raised floor panels provide no means to block or reduce the magnetic field generated by the cables (or transformers).

Conventional techniques for minimizing the magnetic field involve wrapping tools with a magnetic shielding lamina. The lamina is expensive and time consuming to apply and provides only minimal reduction in the magnetic field. Wrapping the tools also fails to account for the magnetic field created by the cables.

BRIEF DESCRIPTION OF THE DRAWINGS

The present disclosure is best understood from the following detailed description when read with the accompanying figures. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

It is understood that the following disclosure provides many different embodiments, or examples, for implementing different features. Specific examples of components and arrangements are described below to simplify the present disclosure. These are, of course, merely examples and are not intended to be limiting.

This description describes a modular magnetic field shielding raised floor panel to block electronic equipment from exposure to magnetic fields. In an embodiment, the magnetic shielding floor panels are provided across the entire surface of a room. In other embodiments, the magnetic shielding raised floor panels are provided only directly above cables and tools and around sensitive equipment. In still other embodiments, the magnetic shielding raised floor panels are positioned in a region above and extending away from cables or tools or around sensitive equipment.

Figure 1:
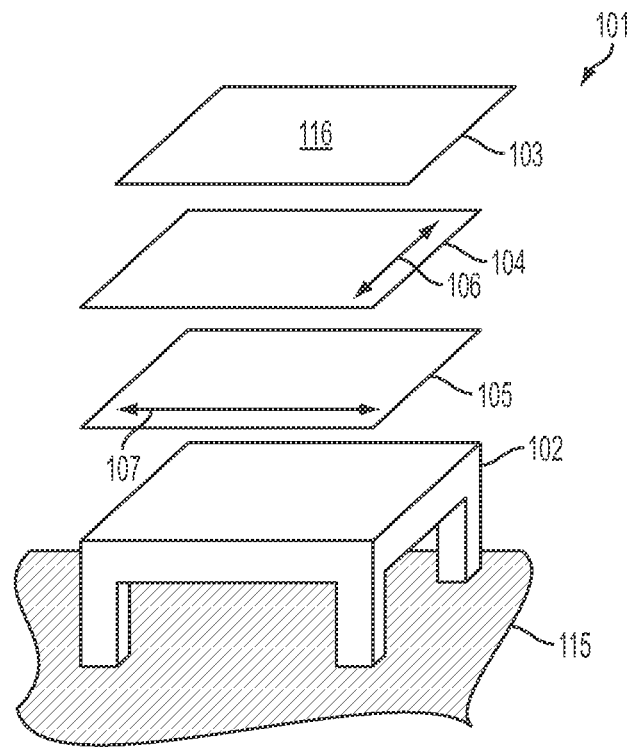
FIG. 1 is an exploded perspective view of a raised floor including a magnetic field shielding raised floor panel according to some embodiments.

In the embodiment of FIG. 1, a raised floor 101 includes a riser 102, a cover plate 103, and a magnetic shielding raised floor panel comprising a second grain-oriented electrical steel (GOES) section 104, and a first GOES section 105. The riser 102 acts as a support to separate a structural level, on surface 115, and the walking level, on surface 116. In some embodiments, riser 102 is permanently attached to the structural level 115 and GOES sections 104 and 105 and cover plate 103 are placed atop riser 102 in a manner that allows easy removal to provide access to power cables or tools. In other embodiments, riser 102 is not permanently attached to the structural level 115, allowing the position of riser 102 to be adjusted to allow different power cable and tool layout designs. In embodiments where riser 102 is not permanently attached to the structural level 115, the GOES sections 104 and 105 and cover plate 103 are either removably placed atop riser 102 or affixed to riser 102. The height of the walking level above the structural level is between about 45 cm to about 95 cm. In alternate embodiments, greater or lesser values for height of the walking level 116 are used. The height is selected based on several parameters including: overall room height, diameters of cables, height of tools, and height of electronic equipment to be placed on the walking level and air flow considerations. In the embodiment of FIG. 1, riser 102 has a solid plate-like top surface. In other embodiments, the top surface of riser 102 has a central opening and supports the GOES sections and cover plate using only the periphery of the riser. In some embodiments, riser 102 comprises a lightweight material having low thermal conductivity. Riser 102 also has sufficient strength to support the weight of the GOES sections and cover plate as well as electronic equipment and people walking on the raised floor. In embodiments where mechanical strength is of primary concern, other material properties of the riser 102, such as weight and thermal conductivity, can be compromised to safely support devices set atop the raised floor. In the embodiment of FIG. 1, riser 102 comprises aluminum. In other embodiments, riser 102 comprises titanium, steel, stainless steel, case iron, nickel-chromium or other suitable materials.

The upper surface of cover plate 103 forms the top surface 116 of the magnetic field shielding raised floor panel. Top surface 116, after the panel is positioned for use, is called the walking level. In some embodiments, cover plate 103 comprises a lightweight material having high scratch resistance and low thermal conductivity. Other material properties such as ease of cleaning, durability and aesthetics are also considered in selecting a cover plate material. In the embodiment of FIG. 1, cover plate 103 comprises polyvinyl chloride. In some embodiments, cover plate 103 comprises stainless steel or other suitable materials.

GOES sections 104 and 105 protect electronic equipment disposed on the walking level by shielding them from magnetic fields. Electrical steel has a silicon concentration between about 0.5% by weight and about 3.2% by weight. Electrical steel can be either isotropic or anisotropic. Isotropic electrical steel does not provide adequate magnetic field shielding. Anisotropic electrical steel blocks magnetic fields when the electrical steel is oriented in a direction parallel to a top surface of the steel and the orientation is parallel to the direction of the magnetic field. Orientation is imparted into electrical steel using a cold rolling process, in which the electrical steel is oriented in the direction of rolling. After the electrical steel is oriented, the electrical steel is referred to as grain-oriented electrical steel (GOES). GOES section 104 has an orientation direction 106 parallel to one side of the GOES section 104 and GOES section 105 has an orientation direction 107 parallel to another side of the GOES section 105. Each GOES section 104 and 105 shields magnetic fields in a direction perpendicular to the orientation direction 106 and 107, respectively. Orientation direction 106 is perpendicular to orientation direction 107 in order to block the magnetic field generated by current passing through a cable regardless of the direction of the current. In other embodiments, the orientation directions are angled with respect to the edges of the top surface, however, the orientation directions remain perpendicular to one another. In still other embodiments, where the direction of the magnetic field is known and constant, the orientation directions are parallel.

GOES sections 104 and 105 have a thickness between about 0.2 mm and about 0.4 mm. In other embodiments, the thickness of the GOES sections is larger or smaller depending on design requirements for the electronic equipment. A larger thickness will provide greater protection from magnetic fields, but will increase the weight of the magnetic shielding raised floor panel. A smaller thickness will decrease the weight of the magnetic shielding raised floor panel but reduce the protection from magnetic fields. One of ordinary skill in the art will recognize the ability to select a desired thickness attuned to the design requirements of the electronic equipment.

In the embodiment of FIG. 1, two GOES sections 104 and 105 are used stacked one above the other. In other embodiments, additional GOES sections are added to increase magnetic field shielding. More GOES sections increase magnetic field shielding, however, weight and cost also increase as the number of GOES sections increases. A determination of the number of GOES sections in a magnetic field shielding raised floor panel depends upon the sensitivity of the equipment.

In the embodiment of FIG. 1, the magnetic field shielding raised floor panel 1 is substantially square. In other embodiments, the magnetic shielding raised floor panel has different shapes, such as rectangles, triangles or other shapes. The shape of the magnetic shielding raised floor panel is selected based on the dimensions of the room.

Figure 2:
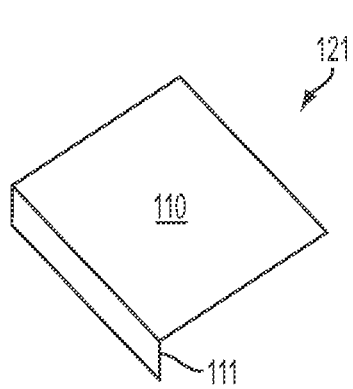
FIG. 2 is a perspective view of a section of grain-oriented electrical steel having a sidewall according to some embodiments.

FIG. 2 is a perspective view of a GOES section 121 in accordance with another embodiment which has a sidewall 111 extending perpendicular to a top surface 110 of the GOES section toward the structural level 115 (shown in FIG. 1) from an edge of the GOES section. Cables can be arrayed in U-shaped baskets, used to organize the cables and enhance air flow beneath the magnetic field shielding raised floor panel. Sidewall 111 helps block magnetic fields emanating at an angle in relation to the top surface 110, by extending downward near the cable baskets (not shown). Sidewall 111 extends in the direction perpendicular to the top surface 110 for a distance between about 3.0 cm and about 5.0 cm. In other embodiments, sidewall 111 extends for a greater or smaller distance. The distance sidewall 111 extends depends upon the height of GOES section 121 above the structural level 115 (shown in FIG. 1). As the height of the riser 102 increases, sidewall 111 must extend a greater distance to effectively block magnetic fields generated by the cables. In an embodiment, only one GOES section in magnetic field shielding raised floor panel has a sidewall 111. In another embodiment, multiple GOES sections in magnetic field shielding raised floor panel have sidewalls 111.

GOES section 121 has one sidewall 111. In other embodiments, the GOES section has multiple sidewalls. In still other embodiments, the GOES section has a sidewall extending from every edge.

Figure 3:
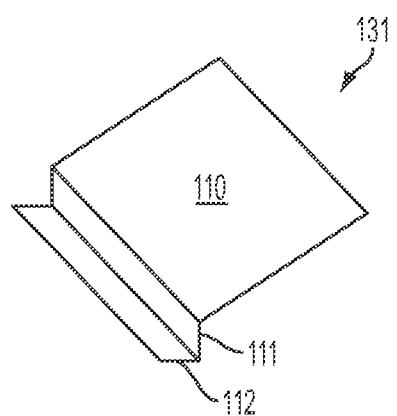
FIG. 3 is a perspective view of a section of grain-oriented electrical steel having a sidewall and a lip portion according to some embodiments.
Figure 5:
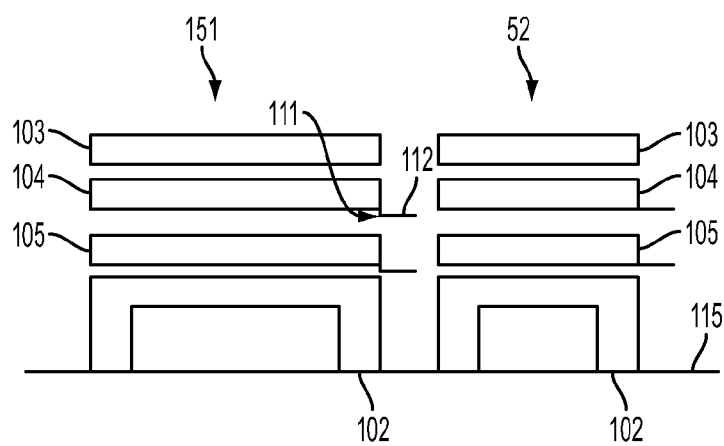
FIG. 5 is a side view of a raised floor including two adjacent magnetic field shielding raised floor panels according to some embodiments.

FIG. 3 is a perspective view of a GOES section 131 in accordance with another embodiment which has a sidewall 111 extending perpendicular to a top surface 110 and a lip portion 112 extending perpendicular to sidewall 11 and parallel to the top surface 110 of the GOES section. The magnetic field shielding raised floor panels are modular, thus when adjacent panels are put into place a small gap exists between the panels. Lip portion 112 helps block magnetic fields from passing through the gap between panels, by extending from one panel to an adjacent panel. In the embodiment of FIG. 5, lip portion 112 extends from a magnetic field shielding raised floor panel 151 to a magnetic field shielding raised floor panel 152, substantially filling the gap between the adjacent panels. In the embodiment of FIG. 3, lip portion 112 extends from sidewall 111 a distance between about 3.0 cm to about 5.0 cm. In other embodiments, lip portion 112 extends a greater or lesser distance from sidewall 111. A greater distance would be advantageous, for example, if a distance between a magnetic shielding raised floor panel and a wall of the room is too small to place another panel, but greater than 5.0 cm. In such an instance, a lip portion extending between the magnetic field shielding raised floor panel and the room wall would block magnetic fields emanating between the panel and room wall. In an embodiment, only one GOES section in magnetic field shielding raised floor panel has a sidewall 111 and a lip portion 112. In another embodiment, multiple GOES sections in magnetic field shielding raised floor panel have sidewalls 111 and lip portions 112. In some embodiments, each GOES section has sidewalls 111 and lip portions 112 extending in substantially the same direction. In other embodiments, different GOES sections have sidewalls 111 and lip portions 112 extending in different directions. For example, if a first square GOES section has a sidewall 111 and lip portion 112 extending in one direction, then a second square GOES section has a sidewall 111 and lip portion 112 extending in a direction offset by 90-degrees or 180-degrees.

GOES section 131 has one sidewall 111 and lip portion 112. In other embodiments, the GOES section has multiple sidewalls and/or lip portions extending from adjacent and/or opposite sides of the GOES section. In still other embodiments, the GOES section has sidewalls and/or lip portions extending from every edge of the GOES section.

Figure 4A:
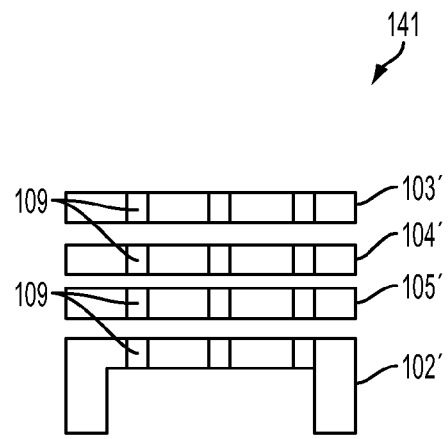
FIG. 4A is a side view of a perforated raised floor including a magnetic field shielding raised floor panel according to some embodiments.

In addition to elevating the walking level above the structural level to provide space for cables and tools, raised floors also enhance ventilation by allowing air to flow through perforated panels. FIG. 4A is a side section view of a perforated raised floor including a magnetic shielding raised floor panel according to one or more embodiments which has openings 109 in the GOES sections 104' and 105' as well as cover plate 103' and riser 102'. If riser 102 has a solid top surface as shown in FIG. 1, riser 102 must also have openings to permit air flow. Openings 109 permit air to flow between the space beneath the panel and the room above. In some embodiments, openings 109 have a diameter of about 220 mm to about 400 mm. In at least some embodiments, openings 109 are larger or smaller diameter. Openings 109 do not block magnetic fields. In some embodiments, openings 109 in adjacent GOES sections are offset from one another to effectively block magnetic fields. In the embodiment of FIG. 4, all the openings 109 of cover plate 103', GOES section 104' and 105', are aligned with openings in riser 102, in order to not restrict air flow.

Figure 4B:
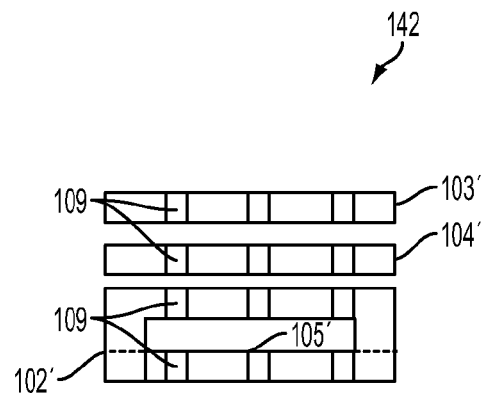
FIG. 4B is a side view of a perforated raised floor including a magnetic field shielding raise floor panel having a grain-oriented electrical steel under a riser according to some embodiments.

In some embodiments, at least one GOES section 104 or 105 is under riser 102. FIG. 4B depicts a perforated raised floor 142 including a magnetic shielding raised floor panel which has openings 109 in GOES sections 104' and 105', as well as cover plate 103' and riser 102'. In the embodiment of FIG. 4B, GOES section 105' is under riser 102'

One aspect of the description relates to a magnetic field shielding raised floor panel having a riser to elevate a walking level about a structural level, a cover plate on the riser, and at least one GOES section interposed between the riser and the cover plate, with the orientation of the GOES section being parallel to a top surface of the GOES section. Another aspect of the description relates to a magnetic field shielding raised floor panel having a riser elevating a walking level above a structural level, a cover plate on the riser and at least one GOES section interposed between the riser and the cover plate with a grain orientation of the GOES section parallel to a top surface of the GOES section and the GOES section having a sidewall and a lip portion. Still another aspect of the description relates to a magnetic field shielding raised floor panel having a riser elevating a walking level above a structural level, a cover plate on the rise and a plurality of GOES sections interposed between the riser and the cover plate with a grain orientation parallel to a top surface of the GOES section and the cover and GOES section are perforated with a plurality of openings and the plurality of openings in a first GOES section do not overlap with the plurality of openings in a second adjacent GOES section.

The above description discloses exemplary embodiments, but they are not intended to be limiting. Elements can be added, replaced or changed as appropriate, in accordance with the spirit and scope of the description. Embodiments that combine different claims and/or different embodiments are within the scope of the description and will be apparent to those skilled in the art after reviewing this disclosure.

The invention claimed is:

1. A magnetic field shielding raised floor panel comprising:
   a stacked plurality of grain-oriented electrical steel (GOES) sections between a magnetic field generating element and a device sensitive to magnetic fields, wherein
   a grain orientation of each GOES section is parallel to a top surface of the GOES section, and
   each GOES section of the stacked plurality of GOES sections having a plurality of openings, the plurality of openings of said each GOES section are aligned with the plurality of openings of at least another GOES section of the stacked plurality of GOES sections.

2. The magnetic field shielding raised floor panel of claim 1, wherein the magnetic field shielding raised floor panel is positioned on top of a riser configured to elevate a top surface of the stacked plurality of GOES sections above a structural level.

3. The magnetic field shielding raised floor panel of claim 1 wherein at least one of the stacked plurality of GOES sections further comprises at least one sidewall extending orthogonal to the top surface toward a structural level.

4. The magnetic field shielding raised floor panel of claim 3, wherein the sidewall extends a distance of about 3 cm to about 5 cm orthogonal to the top surface.

5. The magnetic field shielding raised floor panel of claim 3, wherein at least one of the stacked plurality of GOES sections further comprises at least one lip portion extending parallel to the top surface from an end of the sidewall nearest the structural level.

6. The magnetic field shielding raised floor panel of claim 5, wherein the lip portion extends a distance of about 3 cm to about 5 cm parallel to the top surface.

7. The magnetic field shielding raised floor panel of claim 1 wherein each GOES section is about 0.2 mm to about 0.4 mm thick.

8. The magnetic field shielding raised floor panel of claim 1, wherein two of the stacked plurality of GOES sections have grain orientations orthogonal to each other.

9. The magnetic field shielding raised floor panel of claim 1, wherein the silicon content of the plurality of GOES sections is about 0.5% by weight to about 3.2% by weight.

10. The magnetic field shielding raised floor panel of claim 2, wherein the magnetic field shielding raised floor panel is positioned on the structural level so as to block magnetic fields generated by electrical currents between a walking level and the structural level.

11. The magnetic field shielding raised floor panel of claim 2, wherein the riser comprises aluminum.

12. The magnetic field shielding raised floor panel of claim 1, wherein a cover plate is positioned above the stacked plurality of GOES sections, wherein the cover plate comprises polyvinyl chloride.

13. A raised floor comprising:
   a riser configured to elevate a walking level above a structural level;
   a cover positioned above the riser; and
   a magnetic field shielding raised floor panel comprising:
      a stacked plurality of grain-oriented electrical steel (GOES) sections interposed between the riser and the cover, wherein
      a grain orientation of each GOES section is parallel to a top surface of the GOES section,
      at least one of the stacked plurality of GOES sections further comprises at least one sidewall extending orthogonal to the top surface toward the structural level, and
      at least one of the stacked plurality of GOES sections further comprises at least one lip portion extending parallel to the top surface from an end of the at least one sidewall nearest the structural level.

14. The magnetic field shielding raised floor panel of claim 13, wherein the lip portion contacts an adjacent magnetic field shielding raised floor panel.

15. The magnetic field shielding raised floor panel of claim 13, wherein a plurality of magnetic field shielding raised floor panels are arranged so as to block magnetic fields generated by electrical currents between the walking level and the structural level.

16. A raised floor comprising:
   a riser configured to elevate a walking level above a structural level;
   a cover positioned above the riser; and
   a magnetic field shielding raised floor panel comprising:
      at least one first grain-oriented electrical steel (GOES) section interposed between the riser and the cover, wherein
      a grain orientation of each GOES section is parallel to a top surface of the GOES section,
      the cover and each GOES section are formed with a plurality of through openings to provide ventilation between the structural level and the walking level, and
      the plurality of openings in the at least one first GOES section do not substantially overlap with a plurality of openings in an adjacent second GOES section.

17. The raised floor of claim 16, further comprising at least one second GOES section under the riser, wherein the riser is between the at least one first GOES section and the at least one second GOES section.

18. The raised floor of claim 17, wherein the at least one first GOES section and the at least one second GOES section each have a plurality of openings formed therethrough to provide ventilation between the structural level and the walking level.

19. The raised floor of claim 18, wherein the plurality of openings have a diameter of about 220 mm to about 400 mm.

20. The magnetic field shielding raised floor panel of claim 1, wherein each GOES section of the stacked plurality of GOES sections are substantially parallel with each other GOES section of the stacked plurality of GOES sections.

\* \* \* \* \*